US012696574B2

(12) United States Patent
Huang et al.

(10) Patent No.: US 12,696,574 B2
(45) Date of Patent: Jul. 28, 2026

(54) SOLAR CELL, ALOX DEPOSITING METHOD THEREFOR, AND CELL BACK PASSIVATION STRUCTURE AND METHOD

(71) Applicants: TONGWEI SOLAR (CHENGDU) CO., LTD., Chengdu (CN); TONGWEI SOLAR (JINTANG) CO., LTD., Chengdu (CN)

(72) Inventors: Zhi Huang, Hefei (CN); Lin Zhang, Hefei (CN); Peng Zhang, Hefei (CN); Dong Yang, Hefei (CN); Tao Xu, Hefei (CN); Xujin Zhai, Hefei (CN); Taihong Xie, Hefei (CN); Shengyi Xiao, Hefei (CN)

(73) Assignees: TONGWEI SOLAR (CHENGDU) CO., LTD., Chengdu (CN); TONGWEI SOLAR (JINTANG) CO., LTD., Chengdu (CN)

(*) Notice: Subject to any disclaimer, the term of this patent is extended or adjusted under 35 U.S.C. 154(b) by 436 days.

(21) Appl. No.: 18/251,014

(22) PCT Filed: Mar. 30, 2022

(86) PCT No.: PCT/CN2022/083882
§ 371 (c)(1),
(2) Date: Apr. 28, 2023

(87) PCT Pub. No.: WO2022/206789
PCT Pub. Date: Oct. 6, 2022

(65) Prior Publication Data
US 2023/0378380 A1 Nov. 23, 2023

(30) Foreign Application Priority Data
Mar. 31, 2021 (CN) ........................ 202110346301.X

(51) Int. Cl.
*H10F 77/30* (2025.01)
*H10F 71/00* (2025.01)

(52) U.S. Cl.
CPC ......... *H10F 77/311* (2025.01); *H10F 71/121* (2025.01)

(58) Field of Classification Search
CPC ........... H10P 14/69215; H10P 14/6309; H10P 14/6322; H10P 14/6336; H10P 14/6532;
(Continued)

(56) References Cited

U.S. PATENT DOCUMENTS

2005/0202662 A1* 9/2005 Joshi ................. H01L 21/32105
438/585
2014/0213016 A1 7/2014 Sheng et al.
2022/0209027 A1* 6/2022 Li ......................... H10F 71/129

FOREIGN PATENT DOCUMENTS

CN 1501455 A 6/2004
CN 103531658 B 11/2015
(Continued)

OTHER PUBLICATIONS

Chinese Search Report (w/ English translation) for corresponding Application No. 202110346301.X, dated Oct. 9, 2022, 9 pages.
(Continued)

*Primary Examiner* — Dustin Q Dam
(74) *Attorney, Agent, or Firm* — Dority & Manning, PA

(57) ABSTRACT

The present disclosure relates to the technical field of solar cell preparation, and provides a solar cell, an AlOx depositing method therefor, and a cell back passivation structure and method. In the present disclosure, a silicon wafer which has been subjected to thermal oxidization and annealing is placed into a tubular PECVD equipment. The chamber is vacuumized to a pressure of 100-2000 mTorr and heated to a temperature of 300-400° C. Then nitrous oxide and TMA
(Continued)

as reaction gases are introduced in to the chamber. The radio-frequency power supply is turned on and an AlOx passivation film having two-layer, three-layer, or more-layer film structure is prepared.

9 Claims, 1 Drawing Sheet

(58) Field of Classification Search
  CPC ............. H10P 14/662; H10P 14/69391; H10P
            14/69433; H10P 95/90; H10P 14/6529
  See application file for complete search history.

(56) References Cited

FOREIGN PATENT DOCUMENTS

| | | | | | |
|---|---|---|---|---|---|
| CN | 107731935 A | 2/2018 | | | |
| CN | 108630764 A | 10/2018 | | | |
| CN | 109728104 A | 5/2019 | | | |
| CN | 109802007 A | 5/2019 | | | |
| CN | 110121786 A | 8/2019 | | | |
| CN | 110491949 A | 11/2019 | | | |
| CN | 110735130 A | | 1/2020 | | |
| CN | 110767757 A | * | 2/2020 | ............ | H10F 71/29 |
| CN | 111192935 A | | 5/2020 | | |
| CN | 111628010 A | | 9/2020 | | |
| CN | 112117188 A | | 12/2020 | | |
| CN | 113097341 A | | 7/2021 | | |
| CN | 113097342 A | | 7/2021 | | |
| CN | 114530520 A | * | 5/2022 | ............ | H10F 77/211 |
| EP | 2484801 A1 | | 8/2012 | | |

OTHER PUBLICATIONS

Extended European Search Report for corresponding Application No. 22778971, dated Jun. 12, 2024, 8 pages.
Chinese Notice of Allowance (w/ English translation) and Supplemental Search Report for corresponding Application No. 202110346301. X, dated May 9, 2023, 6 pages.
PCT International Search Report and Written Opinion (w/ English translations) for corresponding PCT Application No. PCT/CN2022/ 083882, mailed May 30, 2022, 13 pages.
Chinese Office Action for corresponding CN Application No. 202110346301.X, 5 pages.

* cited by examiner

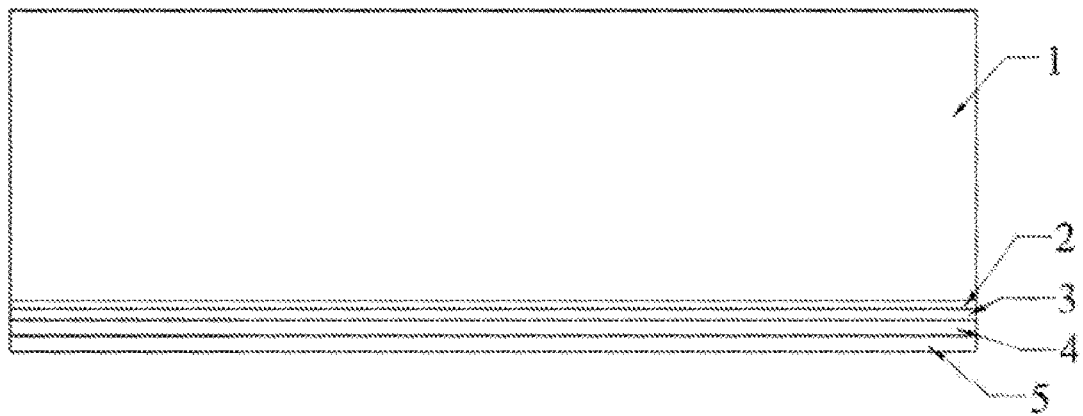

SOLAR CELL, ALOX DEPOSITING METHOD THEREFOR, AND CELL BACK PASSIVATION STRUCTURE AND METHOD

The present disclosure claims priority to Chinese patent application No. 202110346301X, entitled "SOLAR CELL, ALOx DEPOSITING METHOD THEREFOR, AND CELL BACK PASSIVATION STRUCTURE AND METHOD", and filed on Mar. 31, 2021 with China National Intellectual Property Administration, the content of which is hereby incorporated by reference in its entirety.

TECHNICAL FIELD

The present disclosure relates to the technical field of solar cell preparation, and particularly to a solar cell, an AlOx depositing method therefor, and a cell back passivation structure and method.

REARGROUND

A crystalline silicon solar cell is a device that converts light energy into electrical energy utilizing the photovoltaic effect of a PN junction. A passivated emitter and rear cell (PERC) solar cell was first developed in the 1980s by the Martin Green research group at the University of New South Wales in Australia. Unlike the conventional solar cell, the PERC solar cell adopts the techniques of dielectric film passivation and localized metal contact on a back surface thereof, which significantly reduces the back surface recombination rate and increases the back reflection of the cell, thereby greatly improving the long-wave effect of the cell. Early this century, the discovery and research of the passivation effect of an AlOx dielectric film on the back surface of the PERC cell in P-type made the industrialization of the PERC cell gradually possible. Subsequently, with the maturity of the industrialized preparation technology and equipment for depositing AlOx, and the introduction of the laser technology, the PERC technology began to gradually move towards industrialization. The PERC cell has been gradually developed into the mainstream high-efficiency solar cell product and technology in the market since 2017 due to its simple preparation process and low cost.

Currently, a preparation method of an AlOx passivation layer mainly includes atomic layer deposition (ALD), plasma-enhanced atomic layer deposition (PEALD), and plasma-enhanced chemical vapor deposition (PECVD), while physical vapor deposition (PVD) is less commonly used. Among them, the preparation principles of ALD and PEALD are as follows. A precursor of aluminum oxide and a precursor of an oxidizing agent are successively introduced into a reaction chamber, and then an AlOx layer which is an atomic layer is prepared by adsorbing and reacting the precursors on a surface of a silicon wafer. By repeating this process for different times, an AlOx passivation layer with a specified thickness is prepared. The whole AlOx passivation layer obtained herein is prepared under the same process condition, and thus is generally a monolayer film. The chamber needs to be purged to remove reactants and excess precursors after each cycle or adsorption of each precursor. PECVD is a technique using plasma to activate a reactive gas to promote a chemical reaction at a surface or a near-surface space of a substrate to form a solid film. The basic principle of PECVD is that the plasma is formed by ionizing a source gas under the action of a high-frequency or direct-current electric field, and the low-temperature plasma is used as an energy source to activate several reaction gases for preparing AlOx to complete the chemical vapor deposition.

Due to the characteristics of high film-forming rate, easy maintenance, high uptime, flexible process, and the ability to achieve co-preparation with a silicon nitride film on the same equipment and pipe, etc., the tubular PECVD technology has a significant comprehensive cost advantage, and has gradually become the preferred choice of cell manufacturers. However, in the relevant technology, the AlOx film prepared by PECVD is a monolayer film (the same is true for ALD, PEALD, and other methods), and the surface chemical passivation effect and the field passivation effect of the prepared AlOx film still need to be improved. Moreover, in the preparation of a passivation film by PECVD, the silicon wafer substrate can be damaged by plasma bombardment and the chemical passivation effect on the surface of the silicon wafer can be destroyed as well. Therefore, how to reduce the difference in passivation and improve the conversion efficiency of the PERC cell prepared by PECVD method is still a problem that needs to be continuously improved.

In view of the problems associated with the surface chemical passivation effect and the field passivation effect of the AlOx film prepared by the PECVD method, Chinese patent application publication No. CN110767757A discloses an efficient PERC cell back aluminum oxide film and a method for preparing the same. This application discloses a tubular PECVD process comprising steps of (1) TMA and $N_2O$ are adopted to perform PECVD on the back of a silicon slice, and an alumina layer is formed; (2) $NH_3$, namely a hydrogen source is introduced and enters the alumina layer and a P-type silicon surface layer, and a high-hydrogen dielectric film is formed on a P-type silicon back surface; and (3) $N_2O$ is introduced to make the TMA, which does not react, react fully. In this application, $NH_3$ and $N_2O$ are introduced step by step between the formation of AlOx film and the formation of SiNx film to perform H passivation and treat unreacted TMA, respectively, thereby improving the overall passivation effect.

Chinese patent application publication No. CN111192935A discloses a back passivation structure of a tubular PERC solar cell and a method for preparing the same. This application discloses a process comprising: firstly, forming an aluminum oxide layer on the back face of a solar cell piece; then introducing an oxygen-containing mixed gas into tubular PECVD equipment, and treating the aluminum oxide layer by adopting plasma formed by the oxygen-containing mixed gas so as to improve the negative charge density of the aluminum oxide layer; and finally, forming at least one silicon nitride layer on the aluminum oxide layer. In this application, the aluminum oxide passivation layer is treated with oxygen-containing mixed gas to increase the negative charge density of the AlOx film, and improve the field passivation effect.

Although the above-mentioned applications can improve the field passivation effect of the AlOx film to a certain extent, it still needs to be further improved.

SUMMARY

1. Technical Problem to be Solved by the Present Disclosure

The present disclosure provides a solar cell, an AlOx depositing method for the solar cell, a cell back passivation structure, and a cell back passivation method. The present disclosure provides a multi-layer AlOx film, and each layer of the AlOx film is treated with $NH_3$ and $N_2O$, thereby improving the overall passivation effect of the AlOx film. Moreover, a bottom layer of the AlOx film is prepared under a process condition with a low deposition speed and a high oxygen level, further increasing the negative charge density of AlOx and improving the field passivation effect on a back surface of the silicon wafer. An outer layer of the AlOx film is prepared at a high deposition speed, thereby ensuring that the overall time of the process is not affected. The conversion efficiency of the solar cell prepared by the technical route provided in the present disclosure can be increased by 0.05-0.10%.

2. Technical Solutions

For the above purposes, the present disclosure provides the following technical solutions.

The present disclosure provides an AlOx depositing method for a solar cell, including: placing a silicon wafer which has been subjected to thermal oxidization and annealing into a tubular PECVD equipment; vacuumizing a chamber of the tubular PECVD equipment to a pressure of 100 mTorr to 2000 mTorr, heating the chamber to a temperature of 300° C. to 400° C., and then introducing nitrous oxide and trimethylaluminum (TMA) as reaction gases into the chamber; and turning on a radio-frequency power supply of the tubular PECVD equipment and preparing an AlOx passivation film having a two-layer, three-layer, or more-layer film structure, during which each layer of the AlOx film is treated with $NH_3$ and $N_2O$.

In an embodiment, the AlOx passivation film has the two-layer film structure, and two layers of the AlOx film are prepared at different deposition speeds as follows.

A bottom layer of the AlOx film is prepared under following process condition: a nitrous oxide flow rate of 3500 sccm to 4500 sccm, a TMA flow rate of 30 sccm to 60 sccm, a radio-frequency power of 4000 W to 6000 W, a pulse duty ratio of 20:(1000-1500), and a process time of 40 s to 80 s.

A top layer of the AlOx film is prepared under following process condition: a nitrous oxide flow rate of 2500 sccm to 3500 sccm, a TMA flow rate of 50 sccm to 100 sccm, a radio-frequency power of 6000 W to 8000 W, a pulse duty ratio of 20:(800-1200), and a process time of 80 s to 150 s.

The present disclosure provides a back passivation method for a solar cell, comprising:

step 1), preparing a silicon oxide layer on a silicon wafer substrate by an increased oxygen flow rate process in a manner of single-insertion (growing silicon oxide on both sides of single silicon wafer), front-to-front (backs of two silicon wafers being faced outward) or back-to-back;

step 2), preparing a bottom layer of an AlOx film under the process condition for the bottom layer of the AlOx film as described above;

step 3), after removing a residual gas from step 2), introducing $NH_3$ and $N_2O$, and performing H-passivation and oxidation treatment on the bottom layer of the AlOx film;

step 4), after removing a residual gas from step 3), preparing a top layer of the AlOx film under the process condition for the top layer of the AlOx film as described above;

step 5), after removing a residual gas from step 4), introducing $NH_3$ and $N_2O$ while increasing the temperature of the chamber, and performing H-passivation and oxidation treatment on the top layer of the AlOx film; and step 6), increasing the temperature of the chamber to 400-550° C., and preparing a film of silicon nitride or a composite film of silicon nitride in combination with one or both of silicon oxynitride and silicon oxide.

In an embodiment, in step 1), the manner of back-to-back is adopted, and a thermal oxidation process is performed at a temperature of 650° C. to 750° C. with an $O_2$ flow rate of 2500 sccm to 4000 sccm for a time of 20 min to 40 min.

In an embodiment, in step 1), the manner of single-insertion is adopted to prepare silicon oxide layers on both sides of the silicon wafer which has been subjected to an alkaline polishing, and a thermal oxidation process is performed at a temperature of 700° C. with a $O_2$ flow rate of 3000 sccm for a time of 25 mm.

In an embodiment, in step 3) or step 5), the H-passivation and oxidation treatment are performed under the following process condition: a $NH_3$ and $N_2O$ flow rate of 100) sccm to 4000 sccm, a vacuum pressure of 500 mTorr to 2000 mTorr, a radio-frequency power of 2500 W to 5000 W, a pulse duty ratio of 30:(100-500), and a process time of 100 s to 300 s.

In an embodiment, in step 3) to step 5), the residual gas is removed by vacuumizing the chamber under a pressure of 0 mTorr to 100 mTorr for 20 s to 60 s.

The present disclosure provides a back passivation structure for a solar cell, comprising a silicon wafer substrate, a silicon oxide layer disposed on the silicon wafer substrate, and an AlOx layer disposed on the silicon oxide layer. The AlOx layer has a two-layer, three-layer, or more-layer film structure.

In an embodiment, the AlOx layer has the two-layer film structure. A bottom layer of the AlOx layer is prepared under the process condition for the bottom layer of the AlOx film as described above, and a top layer of the AlOx layer is prepared under the process condition for the top layer of the AlOx film as described above.

The present disclosure further provides a back passivation structure for a solar cell. The back passivation structure prepared by the back passivation method as described above.

The present disclosure further provides a solar cell comprising the back passivation structure as described above.

3. Beneficial Advantages

The technical solutions provided in the present disclosure have at least the following remarkable advantages over known technologies.

(1) In view of the fact that the AlOx film prepared in the relevant art is generally a thick monolayer and so any treatment for the AlOx film will not be effective to a sufficiently deep part of the film, the AlOx film in the present disclosure adopts the multiple-layer film structure, and each layer of the AlOx film is simultaneously subjected to hydrogenation and oxidation by using $NH_3$ and $N_2O$ after the preparation thereof, thereby improving the H-passivation effect of the whole AlOx film and improving the field passivation effect of the whole AlOx film due to the increase in the negative charge density.

(2) In the present disclosure, the thermal oxidation and annealing process is performed prior to the depositing of the AlOx passivation film to increase the thickness and the compactness of the silicon oxide on the back surface of the silicon wafer. Moreover, the AlOx passivation film is in form of the multiple-layer film of which the bottom layer is prepared with a low power and a low pulse duty ratio, which reduces the damage to the silicon oxide on the surface of the silicon wafer and improves the surface chemical passivation effect of the back passivation layer.

(3) In the present disclosure, the multiple-layer AlOx film is adopted, and the bottom layer of the AlOx film is prepared under the process condition with a low depositing speed and a high oxygen level, which increases the negative charge density of AlOx and thus improves the field passivation effect on the back surface of the silicon wafer. Moreover, the outer layer of the AlOx film is prepared with a high depositing speed, which ensures that the overall process time is not affected.

(4) The conversion efficiency of the solar cell prepared by the technical route in the present disclosure can be increased by 0.05-0.10%.

BRIEF DESCRIPTION OF THE DRAWINGS

FIG. 1 is a schematic sectional view of a solar cell according to the present disclosure.

The reference signs in the schematic view are illustrated as follows.

1. silicon wafer substrate; 2. silicon oxide layer; 3. bottom layer of AlOx; 4. top layer of AlOx; and 5. silicon nitride composite layer.

DETAILED DESCRIPTION

The present disclosure will now be described in detail with reference to the accompanying drawings and embodiments in order to further understand of the present disclosure.

Example 1

Referring to FIG. 1, a back passivation structure for a solar cell in this Example includes a silicon wafer substrate 1, a silicon oxide layer 2, an AlOx layer, and a silicon nitride composite layer 5. The silicon oxide layer 2 is disposed on a back surface of the silicon wafer substrate 1. The AlOx layer is disposed on the silicon oxide layer 2. The AlOx layer can have a two-layer, three-layer, or more-layer film structure. Various layers can be prepared by deposition processes with the same or different depositing speeds.

In this Example, the two-layer film structure is adopted, and the two layers are prepared at different depositing speeds. The specific process is as follows.

A silicon wafer which has been subjected to thermal oxidization and annealing is placed into a tubular PECVD equipment. The chamber of the tubular PECVD equipment is vacuumized to a pressure of 100 mTorr and heated to a temperature of 300° C. Then nitrous oxide and TMA as reaction gases are introduced into the chamber. The radio-frequency power supply of the tubular PECVD equipment is turned on and an AlOx passivation film is prepared.

A bottom layer 3 (which is close to the surface of the silicon wafer) of the AlOx film is prepared under the following process condition: a nitrous oxide flow rate of 3500 sccm, a TMA flow rate of 30 sccm, a radio-frequency power of 4000 W, a pulse duty ratio of 20:1000, and a process time of 40 s.

A top layer 4 (which is far away from the surface of the silicon wafer) of the AlOx film is prepared under the following process condition: a nitrous oxide flow rate of 2500 sccm, a TMA flow rate of 50 sccm, a radio-frequency power of 6000 W, a pulse duty ratio of 20:800, and a process time of 80 s.

Example 2

A back passivation structure for a solar cell in this Example is substantially the same as that in Example 1, with the exception that the deposition process of the AlOx film in this Example is as follows.

A silicon wafer which has been subjected to thermal oxidization and annealing is placed into a tubular PECVD equipment. The chamber of the tubular PECVD equipment is vacuumized to a pressure of 2000 mTorr and heated to a temperature of 400° C. Then nitrous oxide and TMA as reaction gases are introduced into the chamber. The radio-frequency power supply of the tubular PECVD equipment is turned on and an AlOx passivation film is prepared.

A bottom layer (which is close to the surface of the silicon wafer) of the AlOx film is prepared under the following process condition: a nitrous oxide flow rate of 4500 sccm, a TMA flow rate of 60 sccm, a radio-frequency power of 6000 W, a pulse duty ratio of 20:1500, and a process time of 80 s.

A top layer (which is far away from the surface of the silicon wafer) of the AlOx film is prepared under the following process condition: a nitrous oxide flow rate of 3500 sccm, a TMA flow rate of 100 sccm, a radio-frequency power of 8000 W, a pulse duty ratio of 20:1200, and a process time of 150 s.

Example 3

A back passivation structure for a solar cell in this Example is substantially the same as that in Example 1, with the exception that the deposition process of the AlOx film in this Example is as follows.

A silicon wafer which has been subjected to thermal oxidization and annealing is placed into a tubular PECVD equipment. The chamber of the tubular PECVD equipment is vacuumized to a pressure of 1000 mTorr and heated to a temperature of 340° C. Then nitrous oxide and TMA as reaction gases are introduced into the chamber. The radio-frequency power supply of the tubular PECVD equipment is turned on and an AlOx passivation film is prepared.

A bottom layer (which is close to the surface of the silicon wafer) of the AlOx film is prepared under the following process condition: a nitrous oxide flow rate of 4000 sccm, a TMA flow rate of 50 sccm, a radio-frequency power of 5000 W, a pulse duty ratio of 20:120, and a process time of 60 s.

A top layer (which is far away from the surface of the silicon wafer) of the AlOx film is prepared under the following process condition: a nitrous oxide flow rate of 3000 sccm, a TMA flow rate of 80 sccm, a radio-frequency power of 7000 W, a pulse duty ratio of 20:1000, and a process time of 120 s.

Example 4

A back passivation structure for a solar cell in this Example is substantially the same as that in Example 1, with the exception that the back passivation process of the solar cell in this Example is as follows.

1. Thermal Oxidization and Annealing

The manner of single-insertion (growing silicon oxide on both sides of a silicon wafer) is adopted to prepare silicon oxide layers on both sides of a silicon wafer which has been subjected to alkaline polishing. The thermal oxidization is performed at a temperature of 700° C. with an $O_2$ flow rate of 3000 sccm for a time of 25 min.

2. Preparation of a Bottom Layer of an AlOx Film

The silicon wafer which has been subjected to the thermal oxidization and annealing is placed into a tubular PECVD equipment. The chamber of the tubular PECVD equipment is vacuumized to a pressure of 1000 mTorr and heated to a temperature of 350° C. Then a bottom layer of AlOx is prepared under the following process condition: a nitrous oxide flow rate of 4000 sccm, a TMA flow rate of 50 sccm, a radio-frequency power of 5000 W, a pulse duty ratio of 20:1400, and a process time of 60 s.

3. Vacuumization

After the preparation of the bottom layer of the AlOx film is finished, the residual gas is removed by vacuumizing the chamber under a pressure of 100 mTorr for 60 s.

4. Hydrogenation and Oxidation Treatment for the Bottom Layer of the AlOx Film

After the residual gas is removed, the bottom layer of the AlOx film is subjected to H-passivation and oxidation treatment by introducing $NH_3$ at a flow rate of 3000 sccm and $N_2O$ at flow rate of 3000 sccm, with a vacuum pressure of 1000 mTorr, a radio-frequency power of 4000 W, a pulse duty ratio of 30:200, and a process time of 250 s.

5. Vacuumization

After the hydrogenation and oxidation treatment for the bottom layer of the AlOx film is finished, the residual gas is removed by vacuumizing the chamber under a pressure of 100 mTorr for 60 s.

6. Preparation of a Top Layer of the AlOx Film

After the above steps, a top layer of the AlOx film is prepared under the following process condition: a nitrous oxide flow rate of 3000 sccm, a TMA flow rate of 80 sccm, a radio-frequency power of 7000 W, a pulse duty ratio of 20:1000, and a process time of 100 s.

7. Vacuumization

After the hydrogenation and oxidation treatment for the top layer of the AlOx film is finished, the residual gas is removed by vacuumizing the chamber under a pressure of 100 mTorr for 60 s.

8. Hydrogenation and Oxidation Treatment for the Top Layer of the AlOx Film

After the residual gas is removed, the top layer of the AlOx film is subjected to H-passivation and oxidation treatment by introducing $NH_3$ at a flow rate of 3000 sccm and $N_2O$ at flow rate of 3000 sccm, with a vacuum pressure of 1000 mTorr, a radio-frequency power of 4000 W, a pulse duty ratio of 30:200, and a process time of 250 s.

9. Preparation of a Silicon Nitride Composite Film

The chamber is heated to a temperature of 480° C., and a film of silicon nitride or a composite film of silicon nitride in combination with one or both of silicon oxynitride and silicon oxide is prepared.

Example 5

In this Example, the multiple-layer AlOx back passivation process is as follows.

1. Thermal oxidization and annealing: the increased oxygen flow rate process in the manner of back to back is adopted to increase a thickness and a compactness of the silicon oxide layer on the back surface of the silicon wafer, and the thermal oxidization is performed at a temperature of 650° C. with an $O_2$ flow rate of 2500 sccm for a time of 20 min.

2. Preparation of a bottom layer of an AlOx film: the bottom layer of the AlOx passivation film is prepared according to the PECVD method provided in Example 2, wherein the bottom layer is prepared under the deposition process condition with the low power and the low pulse duty ratio.

3. Vacuumization: after the preparation of the bottom layer of the AlOx film is finished, the residual gas is removed by vacuumizing the chamber under a pressure of 50 mTorr for 20 s.

4. Hydrogenation and oxidation treatment for the bottom layer of the AlOx film: after the residual gas is removed, the bottom layer of the AlOx film is subjected to H-passivation and oxidation treatment by simultaneously introducing $NH_3$ and $N_2O$ at a flow rate of 1000 sccm, with a vacuum pressure of 500 mTorr, a radio-frequency power of 2500 W, a pulse duty ratio of 30:100-500, and a process time of 100 s.

5. Vacuumization: after the hydrogenation and oxidation treatment of the AlOx film is finished, the residual gas is removed by vacuumizing the chamber under a pressure of 50 mTorr for 20 s.

6. Preparation of a top layer of the AlOx film: the top layer of the AlOx film is prepared according to the PECVD method provided in Example 2, wherein the top layer is prepared under the deposition process condition with the high power and the high pulse duty ratio.

7. Vacuumization: after the preparation of the top layer of the AlOx film is finished, the residual gas is removed by vacuumizing the chamber under a pressure of 50 mTorr for 20 s, and the temperature is increased at the same time 8. Hydrogenation and oxidation treatment for the top layer of the AlOx film: after the residual gas is removed, the top layer of the AlOx film is subjected to H-passivation and oxidation treatment by simultaneously introducing $NH_3$ and $N_2O$ at a flow rate of 1000 sccm, with a vacuum pressure of 500 mTorr, a radio-frequency power of 2500 W, a pulse duty ratio of 30:100, and a process time of 100 s.

9. Preparation of a silicon nitride composite film: the chamber is heated to a temperature of 400° C., and a film of silicon nitride or a composite film of silicon nitride in combination with one or both of silicon oxynitride and silicon oxide is prepared.

Example 6

The solar cell provided in this Example can adopt the back passivation structure prepared in any one of Examples 1 to 5.

In the solutions of Examples 1 to 6, in view of the fact that the AlOx film prepared in the relevant art is generally a thick monolayer and so any treatment for the AlOx film will not be effective to a sufficiently deep part of the film, the AlOx film in the present disclosure adopts the multiple-layer film structure, and each layer of the AlOx film is simultaneously subjected to hydrogenation and oxidation by using $NH_3$ and $N_2O$ after the preparation thereof, thereby improving the H-passivation effect of the whole AlOx film and improving the field passivation effect of the whole AlOx film due to the increase in the negative charge density. As the multiple-layer AlOx film is adopted, and the bottom layer of the AlOx film is prepared under the process condition with a low depositing speed and a high oxygen level, the negative charge density of AlOx is increased and thus the field passivation effect on the back surface of the silicon wafer is improved. Moreover, the outer layer of the AlOx film is prepared with a high depositing speed, which ensures that the overall process time is not affected. The thermal oxidation and annealing process is performed prior to the depositing of the AlOx passivation film to increase the thickness and the compactness of the silicon oxide layer on the back surface of the silicon wafer. Moreover, the bottom layer is prepared with a low power and a low pulse duty ratio, which reduces the damage to the silicon oxide on the surface of the silicon wafer and improves the surface chemical passivation effect on the back passivation layer. The conversion efficiency of the PERC solar cell can be increased by 0.05-0.10%.

The present disclosure and embodiments thereof are described by way of example without any limitation. The embodiments shown in the accompany drawing are merely some embodiments of the present disclosure, and the actual structure is not limited thereto. Therefore, if those of ordinary skill in the art are inspired by the present disclosure and design structures and embodiments similar to the present technical solutions without creative work and without departing from the concept of the present disclosure, then these designs and embodiments should all fall within the protection scope of the present disclosure.

INDUSTRIAL APPLICABILITY

The present disclosure provides a solar cell, an AlOx depositing method therefor, and a cell back passivation structure and method. The present disclosure provides an multilayer AlOx film, and each layer of the AlOx film is treated with $NH_3$ and $N_2O$, thereby improving the overall passivation effect of the AlOx film. Moreover, the bottom layer is prepared under the process condition with a low deposition speed and a high oxygen level, further increasing the negative charge density of AlOx and improving the field passivation effect on the back surface of the silicon wafer. The outer layer is prepared using a high deposition speed, which ensures that the overall process time is not affected. The conversion efficiency of the solar cell prepared by the technical route in the present disclosure can be increased by 0.05-0.10%.

Moreover, it can be understood that the solar cell, the AlOx depositing method therefor, and the cell back passivation structure and method can be reproducible and can be used in a variety of industrial applications. For example, the AlOx depositing method and the cell back passivation structure and method in the present disclosure can be used in the technical field of solar cell preparation.

What is claimed is:

1. An AlOx depositing method for a solar cell, comprising:

placing a silicon wafer which has been subjected to thermal oxidization and annealing into a tubular PECVD equipment;

vacuumizing a chamber of the tubular PECVD equipment to a pressure of 100 mTorr to 2000 mTorr, heating the chamber to a temperature of 300° C. to 400° C., and then introducing nitrous oxide and trimethylaluminum (TMA) as reaction gases into the chamber; and turning on a radio-frequency power supply of the tubular PECVD equipment and preparing an AlOx passivation film having a two-layer film structure, during which each layer of the AlOx passivation film is treated with $NH_3$ and $N_2O$;

wherein two layers of the AlOx passivation film are prepared at different depositing speeds, wherein:

a bottom layer of the AlOx passivation film is prepared under following process condition: a nitrous oxide flow rate of 3500 sccm to 4500 sccm, a TMA flow rate of 30 sccm to 60 sccm, a radio-frequency power of 4000 W to 6000 W, a pulse duty ratio of 20:(1000-1500), and a process time of 40 s to 80 s; and a top layer of the AlOx passivation film is prepared under following process condition: a nitrous oxide flow rate of 2500 sccm to 3500 sccm, a TMA flow rate of 50 sccm to 100 sccm, a radio-frequency power of 6000 W to 8000 W, a pulse duty ratio of 20:(800-1200), and a process time of 80 s to 150 s.

2. A back passivation method for a solar cell, comprising:

step 1), preparing a silicon oxide layer on a silicon wafer substrate by an increased oxygen flow rate process in a manner of single-insertion, front-to-front, or back-to-back;

step 2), placing the silicon wafer substrate from step 1) into a tubular PECVD equipment, vacuumizing a chamber of the tubular PECVD equipment to a pressure of 100 mTorr to 2000 mTorr, heating the chamber to a temperature of 300° C. to 400° C., then introducing nitrous oxide and trimethylaluminum (TMA) as reaction gases into the chamber, turning on a radio-frequency power supply of the tubular PECVD equipment, and preparing a bottom layer of an AlOx film under the following process condition: a nitrous oxide flow rate of 3500 sccm to 4500 sccm, a TMA flow rate of 30 sccm to 60 sccm, a radio-frequency power of 4000 W to 6000 W, a pulse duty ratio of 20:(1000-1500), and a process time of 40 s to 80 s;

step 3), after removing a residual gas from step 2), introducing $NH_3$ and $N_2O$, and performing H-passivation and oxidation treatment on the bottom layer of the AlOx film;

step 4), after removing a residual gas from step 3), preparing a top layer of the AlOx film under the following process condition: a nitrous oxide flow rate of 2500 sccm to 3500 sccm, a TMA flow rate of 50 sccm to 100 sccm, a radio-frequency power of 6000 W to 8000 W, a pulse duty ratio of 20:(800-1200), and a process time of 80 s to 150 s;

step 5), after removing a residual gas from step 4), introducing $NH_3$ and $N_2O$ while increasing the temperature of the chamber, and performing H-passivation and oxidation treatment on the top layer of the AlOx film; and step 6), heating the chamber to a temperature to 400° C. to 550° C., and preparing a film of silicon nitride or a composite film of silicon nitride in combination with one or both of silicon oxynitride and silicon oxide.

3. The back passivation method of claim 2, wherein in step 1), the manner of back-to-back is adopted, and a thermal oxidation is performed at a temperature of 650° C. to 750° C. with a $O_2$ flow rate of 2500 sccm to 4000 sccm for a time of 20 min to 40 min.

4. The back passivation method of claim 2, wherein in step 1), the manner of single insertion is adopted to prepare silicon oxide layers on both sides of the silicon wafer substrate which has been subjected to an alkaline polishing, and a thermal oxidation is performed at a temperature of 700° C. with a $O_2$ flow rate of 3000 sccm for a time of 25 min.

5. The back passivation method of claim 2, wherein in step 3) or step 5), the H-passivation and oxidation treatment is performed on the AlOx film under following process condition: a $NH_3$ and $N_2O$ flow rate of 1000 sccm to 4000 sccm, a vacuum pressure of 500 mTorr to 2000 mTorr, a radio-frequency power of 2500 W to 5000 W, a pulse duty ratio of 30:(100-500), and a process time of 100 s to 300 s.

6. The back passivation method of claim 5, wherein in step 3) to step 5), the residual gas is removed by vacuumizing the chamber under a pressure of 0 mTorr to 100 mTorr for 20 s to 60 s.

7. A back passivation structure for a solar cell, comprising a silicon wafer substrate and a silicon oxide layer disposed on the silicon wafer substrate, characterized in that an AlOx film is disposed on the silicon oxide layer, and the AlOx film has a two-layer film structure, wherein the AlOx film is prepared by:

placing the silicon wafer substrate with the silicon oxide layer into a tubular PECVD equipment;

vacuumizing a chamber of the tubular PECVD equipment to a pressure of 100 mTorr to 2000 mTorr, heating the chamber to a temperature of 300° C. to 400° C., and then introducing nitrous oxide and trimethylaluminum (TMA) as reaction gases into the chamber; and turning on a radio-frequency power supply of the tubular PECVD equipment and preparing the AlOx film, during-which each layer of the AlOx film is treated with $NH_3$ and $N_2O$;

wherein a bottom layer of the AlOx film is prepared under the following process condition: a nitrous oxide flow rate of 3500 sccm to 4500 sccm, a TMA flow rate of 30 sccm to 60 sccm, a radio-frequency power of 4000 W to 6000 W, a pulse duty ratio of 20:(1000-1500), and a process time of 40 s to 80 s;

wherein a top layer of the AlOx film is prepared under the following process condition: a nitrous oxide flow rate of 2500 sccm to 3500 sccm, a TMA flow rate of 50 sccm to 100 sccm, a radio-frequency power of 6000 W to 8000 W, a pulse duty ratio of 20:(800-1200), and a process time of 80 s to 150 s.

8. The back passivation structure of claim 7, wherein the back passivation structure is prepared by a back passivation method comprising:

step 1), preparing the silicon oxide layer on the silicon wafer substrate by an increased oxygen flow rate process in a manner of single-insertion, front-to-front, or back-to-back;

step 2), placing the silicon wafer substrate from step 1) into a tubular PECVD equipment, vacuumizing a chamber of the tubular PECVD equipment to a pressure of 100 mTorr to 2000 mTorr, heating the chamber to a temperature of 300° C. to 400° C., then introducing nitrous oxide and trimethylaluminum (TMA) as reaction gases into the chamber, turning on a radio-frequency power supply of the tubular PECVD equipment, and preparing a bottom layer of the AlOx film under the following process condition: a nitrous oxide flow rate of 3500 sccm to 4500 sccm, a TMA flow rate of 30 sccm to 60 sccm, a radio-frequency power of 4000 W to 6000 W, a pulse duty ratio of 20:(1000-1500), and a process time of 40 s to 80 s;

step 3), after removing a residual gas from step 2), introducing $NH_3$ and $N_2O$, and performing H-passivation and oxidation treatment on the bottom layer of the AlOx film;

step 4), after removing a residual gas from step 3), preparing a top layer of the AlOx film under the following process condition: a nitrous oxide flow rate of 2500 sccm to 3500 sccm, a TMA flow rate of 50 sccm to 100 sccm, a radio-frequency power of 6000 W to 8000 W, a pulse duty ratio of 20:(800-1200), and a process time of 80 s to 150 s;

step 5), after removing a residual gas from step 4), introducing $NH_3$ and $N_2O$ while increasing the temperature of the chamber, and performing H-passivation and oxidation treatment on the top layer of the AlOx film; and step 6), heating the chamber to a temperature to 400° C. to 550° C., and preparing a film of silicon nitride or a composite film of silicon nitride in combination with one or both of silicon oxynitride and silicon oxide.

9. A solar cell, comprising the back passivation structure of claim 7.

* * * * *